(12) United States Patent
Franklin

(10) Patent No.: US 8,190,028 B2
(45) Date of Patent: May 29, 2012

(54) METHOD AND APPARATUS FOR TREATING A RECEIVED SIGNAL TO PRESENT A RESULTING SIGNAL WITH IMPROVED SIGNAL ACCURACY

(75) Inventor: James D. Franklin, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 897 days.

(21) Appl. No.: 12/238,116

(22) Filed: Sep. 25, 2008

(65) Prior Publication Data

US 2010/0073092 A1 Mar. 25, 2010

(51) Int. Cl.
*H04J 14/02* (2006.01)

(52) U.S. Cl. .......................................... 398/95; 398/85

(58) Field of Classification Search .................. 398/85, 398/95, 196; 375/350
See application file for complete search history.

(56) References Cited

U.S. PATENT DOCUMENTS

| | | | |
|---|---|---|---|
| 3,566,126 A | 2/1971 | Lang et al. | |
| 4,054,842 A * | 10/1977 | Elliott | 329/300 |
| 4,947,134 A | 8/1990 | Olsson | |
| 5,062,150 A | 10/1991 | Swanson et al. | |
| 5,475,520 A | 12/1995 | Wissinger | |
| 5,517,016 A | 5/1996 | Lesh et al. | |
| 5,592,320 A | 1/1997 | Wissinger | |
| 5,710,652 A | 1/1998 | Bloom et al. | |
| 5,973,310 A | 10/1999 | Lunscher | |
| 6,097,522 A | 8/2000 | Maerki et al. | |

* cited by examiner

*Primary Examiner* — Armando Rodriguez
(74) *Attorney, Agent, or Firm* — Law Office of Donald D. Mondul

(57) ABSTRACT

A signal treating apparatus for presenting an output signal representing an input signal over a signal range includes: (a) an input section receiving the input signal and presenting a first filtered signal limited to a first bandwidth at a first circuit locus; the input section presenting a second filtered signal limited to a second bandwidth at a second circuit locus; (b) an amplifying unit receiving the first filtered signal and presenting an increased gain signal at an amplifier output locus; (c) a detector coupled with the amplifier output locus and presenting third bandwidth-limited signal limited to a third bandwidth less than the first bandwidth at a third circuit locus; and (d) a combining section coupled with the second and third circuit loci and presenting a resulting signal related with the second filtered signal and the third filtered signal; said resultant signal being said output signal.

12 Claims, 3 Drawing Sheets

METHOD AND APPARATUS FOR TREATING A RECEIVED SIGNAL TO PRESENT A RESULTING SIGNAL WITH IMPROVED SIGNAL ACCURACY

The invention was made with Government support under Contract Number FA8808-04-C-0022 awarded by the Air Force. The Government has certain rights in this invention.

FIELD OF THE DISCLOSURE

The present disclosure may be directed to signal treating apparatuses and methods, and especially to signal treating apparatuses and methods for treating a received signal to present a resulting signal having reduced signal deviations to produce a substantially accurate representation of the received signal.

BACKGROUND

A useful employment for the apparatus and method disclosed may be to provide a telemetry signal of received power which may be linear in decibels and continuous over a large dynamic range. An inherent difficulty of obtaining a linear telemetry signal over the input power dynamic range may arise from (1) the low Signal to Noise Ratio (SNR) at the low end of the dynamic range, and (2) saturation of an amplifier (such as by way of example and not by way of limitation, a Low Noise Amplifier (LNA)) at the high end of the dynamic range. Prior art approaches to overcoming this challenge may have used a processor which looks at the output power before and after a saturating stage of an LNA. The processor may make a crossover decision as to whether to use output power before or after the LNA. This prior art approach may be subject to alignment difficulties and requires a hysteresis band.

There may be a need for a method and apparatus for treating a received signal to present a resulting signal with improved signal accuracy.

SUMMARY

A signal treating apparatus for presenting an output signal representing an input signal over a signal range includes: (a) an input section receiving the input signal and presenting a first filtered signal limited to a first bandwidth at a first circuit locus; the input section presenting a second filtered signal limited to a second bandwidth at a second circuit locus; (b) an amplifying unit receiving the first filtered signal and presenting an increased gain signal at an amplifier output locus; (c) a detector coupled with the amplifier output locus and presenting third bandwidth-limited signal limited to a third bandwidth less than the first bandwidth at a third circuit locus; and (d) a combining section coupled with the second and third circuit loci and presenting a resulting signal related with the second filtered signal and the third filtered signal; said resultant signal being said output signal.

A method for treating a received signal to present a resulting signal representing the received signal with improved signal accuracy; the method including: (a) in no particular order: (1) effecting a first filtering of the received signal according to a first bandpass characteristic to present a first filtered signal at a first circuit locus; and (2) effecting a second filtering of the received signal according to a second bandpass characteristic to present a second filtered signal at a second circuit locus; (b) amplifying the first bandpass representation to present a high gain signal; (c) effecting a third bandwidth-limiting of the high gain signal to present a third bandwidth-limited signal at a third circuit locus; the third bandwidth-limited signal presenting a narrower band than the first bandpass representation; and (d) combining the second filtered signal with the third filtered signal to present the resulting signal.

It may therefore be a feature of the present disclosure to provide a method and apparatus for treating a received signal to present a resulting signal with improved signal accuracy.

Further features of the present disclosure may be apparent from the following specification and claims when considered in connection with the accompanying drawings, in which like elements may be labeled using like reference numerals in the various figures, illustrating the preferred embodiments of the disclosure.

DETAILED DESCRIPTION

Figure 1:
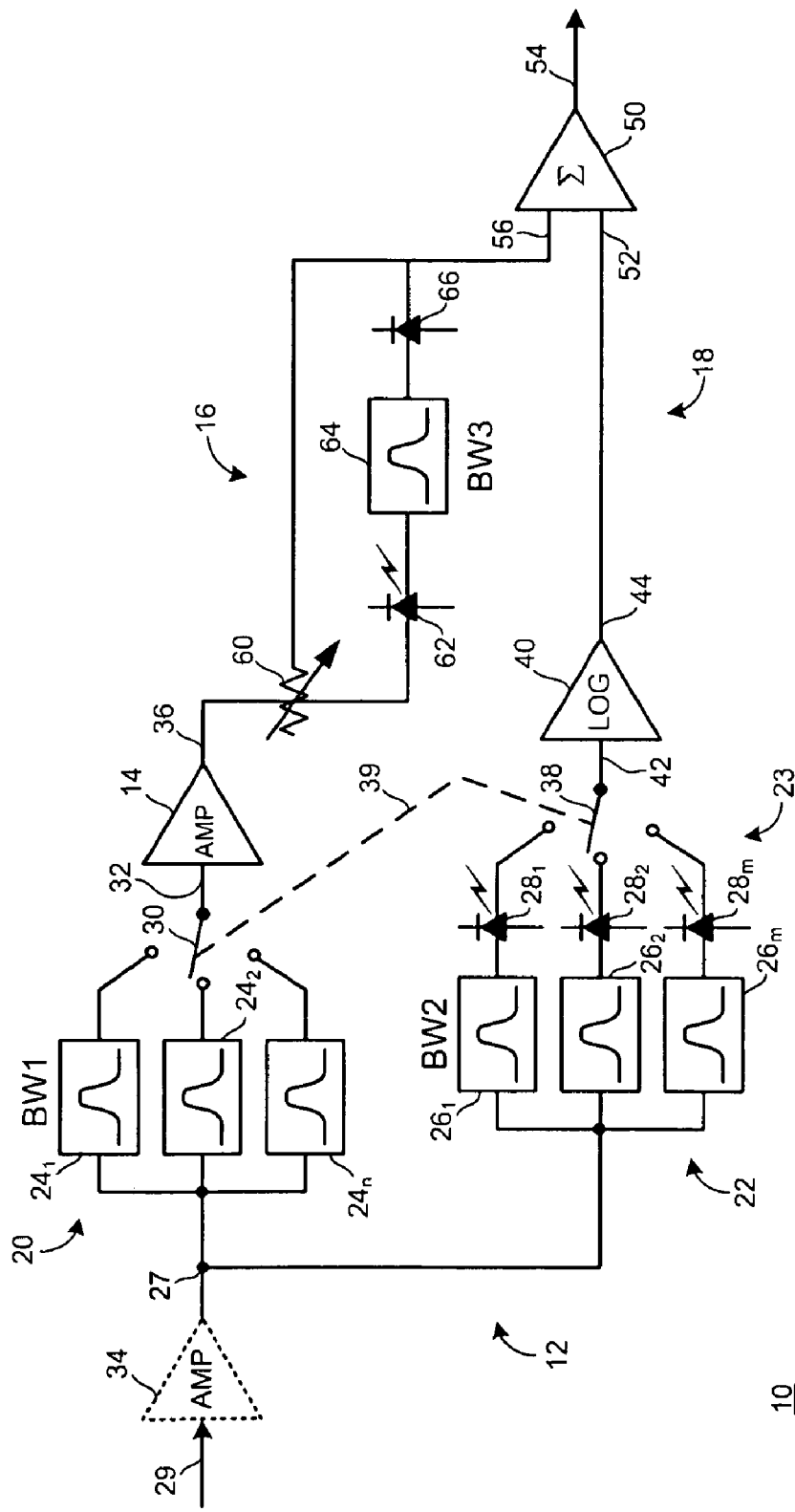
FIG. 1 is a schematic diagram of the apparatus of the present disclosure.

FIG. 1 is a schematic diagram of the apparatus of the present disclosure. In FIG. 1, an apparatus 10 may include an input signal receiving section 12, an amplifying unit 14, a first detection portion 23, a second detection portion 16 and a combining section 18.

Amplifying unit 14 may have an input 32 and an output 36. Combining unit 18 may include a logarithmic amplifier unit 40 and a summing unit 50. Logarithmic amplifier unit 40 may have an input 42 and an output 44. Summing unit 50 may have inputs 52, 56 and an output 54. Output 44 may be coupled with input 52.

Input signal receiving section 12 may include a first bandwidth limiting device 20 and a second bandwidth limiting device 22. First bandwidth limiting device 20 may include a plurality of first bandpass filtering units $24_1$, $24_2$, $24_n$. The indicator "n" is employed to signify that there can be any number of first bandpass filtering units in apparatus 10. The inclusion of three first bandpass filtering units $24_1$, $24_2$, $24_n$ in FIG. 1 is illustrative only and does not constitute any limitation regarding the number of first bandpass filtering units that may be included in the apparatus of the present disclosure.

Second bandwidth limiting device 22 may include a plurality of second bandpass filtering units $26_1$, $26_2$, $26_m$. The indicator "m" is employed to signify that there can be any number of second bandpass filtering units in apparatus 10. The inclusion of three second bandpass filtering units $26_1$, $24_2$, $26_m$ in FIG. 1 is illustrative only and does not constitute any limitation regarding the number of second bandpass filtering units that may be included in the apparatus of the present disclosure.

First detection portion 23 may include optical detector units $28_1$, $28_2$, $28_m$. Each respective optical detector unit $28_m$ may be coupled with a respective second bandpass filtering unit $26_m$ so that optical detector unit $28_1$ may be coupled with second bandpass filtering unit $26_1$, optical detector unit $28_2$ may be coupled with second bandpass filtering unit $26_2$ and optical detector unit $28_m$ may be coupled with second bandpass filtering unit $26_m$.

First bandpass filtering units $24_1$, $24_2$, $24_n$ may be commonly coupled with a circuit locus 27 and may be presented for selective inclusion in circuitry by a selecting switch 30. Selecting switch 30 may be coupled with input 32 of amplifying unit 14. Locus 27 may be coupled with an input locus 29. Input signal receiving section 12 may also include an initial amplifying unit 34 coupled between loci 27, 29. The optional nature of initial amplifying unit 34 may be indicated by employment of a dotted line format in representing initial amplifying unit 34.

Second bandpass filtering units $26_1$, $26_2$, $26_m$ may be commonly coupled with circuit locus 27 and may be presented for selective inclusion in circuitry by a selecting switch 38. Selecting switch 38 may selectively couple a respective second bandpass filtering unit $26_m$ with input 42 of logarithmic amplifier unit 40 via a respective optical detector unit $28_m$.

Each respective first bandpass filtering unit $24_1$, $24_2$, $24_n$ may effect filtering of signals to a respective frequency band so that first bandpass filtering unit $24_1$ may filter signals to a frequency band centered on a frequency $f_1$. First bandpass filtering unit $24_2$ may filter signals to a frequency band centered on a frequency $f_2$. First bandpass filtering unit $24_n$ may filter signals to a frequency band centered on a frequency $f_n$.

Each respective second bandpass filtering unit $26_1$, $26_2$, $26_m$ may effect filtering of signals to a respective frequency band. It may be preferred that frequency bands selectable for filtering by second bandpass filtering units $26_1$, $26_2$, $26_m$ may be substantially the same as frequency bands selectable for filtering by first bandpass filtering units $24_1$, $24_2$, $24_n$. In such an arrangement, second bandpass filtering unit $26_1$ may filter signals to a frequency band centered on frequency $f_1$. Second bandpass filtering unit $26_2$ may filter signals to a frequency band centered on frequency $f_2$. Second bandpass filtering unit $26_m$ may filter signals to a frequency band centered on frequency $f_n$. Further in such an arrangement, n may be equal with m.

When received signals provided at input locus 29 may include optical signals, each respective second bandpass filtering unit $26_1$, $26_2$, $26_m$ may be coupled with an optical detector unit $28_1$, $28_2$, $28_m$ so that second bandpass filtering unit $26_m$ may be coupled with an optical detector unit $28_1$, second bandpass filtering unit $26_2$ may be coupled with an optical detector unit $28_2$ and second bandpass filtering unit $26_m$ may be coupled with an optical detector unit $28_m$.

Selecting switches 30, 38 may be ganged together, as may be indicated by a dashed line 39, to assure that similarly filtered signals may be presented at inputs 32, 42. That is, to ensure that bandwidth BW1 of signals provided from first bandwidth limiting device 20 may be substantially equal with bandwidth BW2 of signals provided from second bandwidth limiting device 22. Thus, when selecting switch 30 may be positioned for selecting first bandpass filtering unit $24_1$, selecting switch 38 may be positioned for selecting second bandpass filtering unit $26_2$ and a frequency band centered on frequency $f_2$ may be presented at inputs 32, 42. When selecting switch 30 may be positioned for selecting first bandpass filtering unit $24_2$, selecting switch 38 may be positioned for selecting second bandpass filtering unit $26_2$ and a frequency band centered on frequency $f_2$ may be presented at inputs 32, 42. When selecting switch 30 may be positioned for selecting first bandpass filtering unit $24_n$, selecting switch 38 may be positioned for selecting second bandpass filtering unit $26_m$ and a frequency band centered on frequency $f_n$ (recall that n=m) may be presented at inputs 32, 42.

Power into amplifying unit 14 may be expressed as:

$$P_i = S_i + N_i \quad (1)$$

Where $P_i$ may be power present at input 32 of amplifier unit 14,
$S_i$ may be signal strength present at input 32, and
$N_i$ may be noise present at input 32.

Power into input signal detection circuit 12 may be expressed as:

$$P_{ti} = S1_{det} + N1_{det} = f(x) \quad (2)$$

Where, $P_{ti}$ may be total input power to input signal detection circuit 12,
$S1_{det}$ may be signal strength detected at input 42, and
$N1_{det}$ may be noise density detected at input 42.

Second detection portion 16 may be coupled between output 36 of amplifying unit 14 and an input 56 of summing unit 50. Second detection portion 16 may include a variable attenuator 60, an optical detector unit 62, a third bandwidth limiting device 64 and an electrical detector unit 66. Variable attenuator 60 may be coupled with output 36 and with optical detector unit 62. Third bandwidth limiting device 64 may be coupled between optical detector unit 62 and electrical detector unit 66. Electrical detector unit 66 may be coupled with third bandwidth limiting device 64, with variable attenuator 60 in a first order control loop. Electrical detector unit 66 may also be coupled with input 56 to summing unit 50. Variable attenuator 60 may employ signals from electrical detector unit 66 to maintain signal levels at output 36 at a substantially constant level. Second detection portion 16 may be thus configured for treating a higher gain signal appearing at output 36 than may be presented at input 42 of logarithmic amplifier unit 40. Further, when third bandwidth limiting device 64 may be configured to limit signals to a third bandwidth BW3 that may be narrower than bandwidths to which signals may be limited by first bandwidth limiting device 20 (BW1) or second bandwidth limiting device 22 (BW2). Higher gain, lesser bandwidth treatment of signals may provide that signals provided from electrical detector unit 66 may exhibit a higher Signal-to-Noise Ratio (SNR) than may be exhibited by signals provided from bandwidth limiting devices 20, 22.

When amplifier unit 14 may be in a saturated condition apparatus 10 may take advantage of amplifier average power saturation characteristics in a unique and subtle way to combine the input signals at input 42 with output signals at output 36 to obtain a substantially seamless continuous response signal with a simple circuit design.

Apparatus 10, as illustrated in FIG. 1, may be configured for use with an optical communication system. One skilled in the art of signal handling apparatuses and methods may recognize that apparatus 10 may be employed with any communication system having an average power saturation amplifier. By way of example and not by way of limitation, apparatus 10 may provide benefit to a Transformational Satellite (TSAT) Communication System and to future communication programs by providing improved performance and simplicity of design.

As may be recognized by one skilled in the art of signal treatment, when signals received at input locus 29 may be entirely embodied in radio frequency (RF) signals, second detection portion 16 may be embodied in another feedback control configuration such as, by way of example and not by way of limitation, a phase locked loop.

Apparatus 10 may take particular advantage of the output Low Noise Amplifier (LNA) stage (embodied in amplifier unit 14 in FIG. 1) always being saturated. Saturation may be a result of noise or a result of a combination of both signal and noise power. A mathematical analysis may provide insight into the operation of apparatus 10. FIG. 1 may illustrate a representative placement of optical filters, amplifiers and detection circuits that may be employed to determine the signal plus noise power at the saturating amplifier input and the signal power at the saturating amplifier output. As may be seen from FIG. 1, the output total power $P_{TO}$ at output 36 may be substantially constant. $P_{TO}$ may be expressed in the relationship:

$$P_{to}=S_o+N_o=\text{Constant} \quad (3)$$

Where $P_{to}$ may be total output power from amplifier unit 14, $S_o$ may be signal strength detected at output 36, and
$N_o$ may be noise density detected at output 36.

Second detection portion 16 may employ a synchronous detection approach to detect an amplifier output signal received from output 36 by varying optical attenuator 60 using input signal power variation indicated at electrical detector unit 66 to hold the output signal power received by second detection portion 16 from output 36 substantially constant. The attenuator control function g(x) employed by variable attenuator 60 may be shown below in EQN (3) where x is the Signal to Noise Ratio (SNR):

$$\text{Attenuation} = \frac{1}{g(x)} = \frac{N2_{det}}{N_o} \quad (4)$$

Where $N2_{det}$ may be noise detected by second detection portion 16.

No may make up total noise into second detection portion 16. $N2_{det}$ may make up the total noise at the input of optical detector unit 62. For all practical purposes the SNR may be considered the same after the BW1 filter (first bandwidth limiting device 20) and may be used to represent the input signal power to the LNA because $N_i$ (noise into amplifier 14) is substantially a constant, as may be seen in EQN (5):

$$\text{Signal} = x = \frac{S_i}{N_i} = \frac{S_o}{N_o} = \frac{S2_{det}}{N2_{det}} \quad (5)$$

Where $S2_{det}$ may be signal strength detected by second detection portion 16 although $S2_{det}$ may be measured at optical detector unit 62.

Using EQNs (3), (4) and (5) the control function for variable attenuator 60 may be found using EQN (6):

$$P_{to}=S_o+N_o=\text{Constant}=N_o(x+1) \quad (6)$$

Both $P_{to}$ and $S2_{det}$ may be substantially constants so g(x) may have the nonlinear relationship shown in EQN (7):

$$g(x) = \frac{P_{to}}{N2_{det}(x+1)} = \left(\frac{P_{to}}{S2_{det}}\right) \cdot \left(\frac{x}{x+1}\right) \quad (7)$$

Because two different band limiting filters may be used, noise into input signal detecting circuit 12 may be adjusted by the ratio of the two filter bandwidths BW1, BW2. The noise density, represented by nd, as shown in EQN (8) may be the same at each filter output:

$$n_d = \frac{N_i}{BW1} = \frac{N1_{det}}{BW2} = \text{Constant} \quad (8)$$

EQN (8) may be rewritten as EQN (9):

$$N1_{det} = \alpha N_i \quad (9)$$

where $$\alpha = \left(\frac{BW2}{BW1}\right)$$

The signal at input signal detection circuit 12 may be substantially the same as the input signal to amplifying unit 14 as shown in EQN (10):

$$S1_{det}=S_i \quad (10)$$

Using EQNs (2), (5), (9), and (10) the input detector transfer function f(x) may be calculated in EQN (11).

$$P_{ti}=S1_{det}+N1_{det}=f(x)=S_i+\alpha N_i=N_i(x+\alpha) \quad (11)$$

The nonlinear input function f(x) (EQN(11)) and output detection circuit function g(x) (EQN(7)) may now be combined using EQN (12) to form a linear telemetry signal when α=1, as shown in EQN (13).

$$h(x)=f(x) \cdot g(x) \quad (12)$$

$$h(x) = \left(\frac{P_{to} \cdot N_i}{S2_{det}}\right) \cdot \left(\frac{x+\alpha}{x+1}\right) \cdot x \quad (13)$$

The first term in equation (13) may involve all constant values so h(x) may be simply a function proportional to the input signal over the entire dynamic range. The operation may be substantially seamless and nearly linear when alpha may be a value other than unity.

When EQN (12) may be converted to decibels by taking the logarithm such as, by way of example and not by way of limitation, by employing logarithmic amplifier unit 40, the two input and output functions f(x) and g(x) may be added together rather than multiplied, which simplifies the circuit design as illustrated by way of example and not by way of limitation in FIG. 1 using summing unit 50. In FIG. 1, second detection portion 16 may not need a logarithmic amplifier because voltage from second detection portion 16 is already proportional to decibels.

Apparatus 10 may be an implementation simple in design but subtle in operation. The simple design may provide a high reliability approach to improving accuracy of reproducing a received signal over a wider amplitude and signal strength ranges than may have been achieved using prior art devices, and may not be as susceptible to amplifier and circuit variation as prior art signal treating apparatuses.

Figure 2:
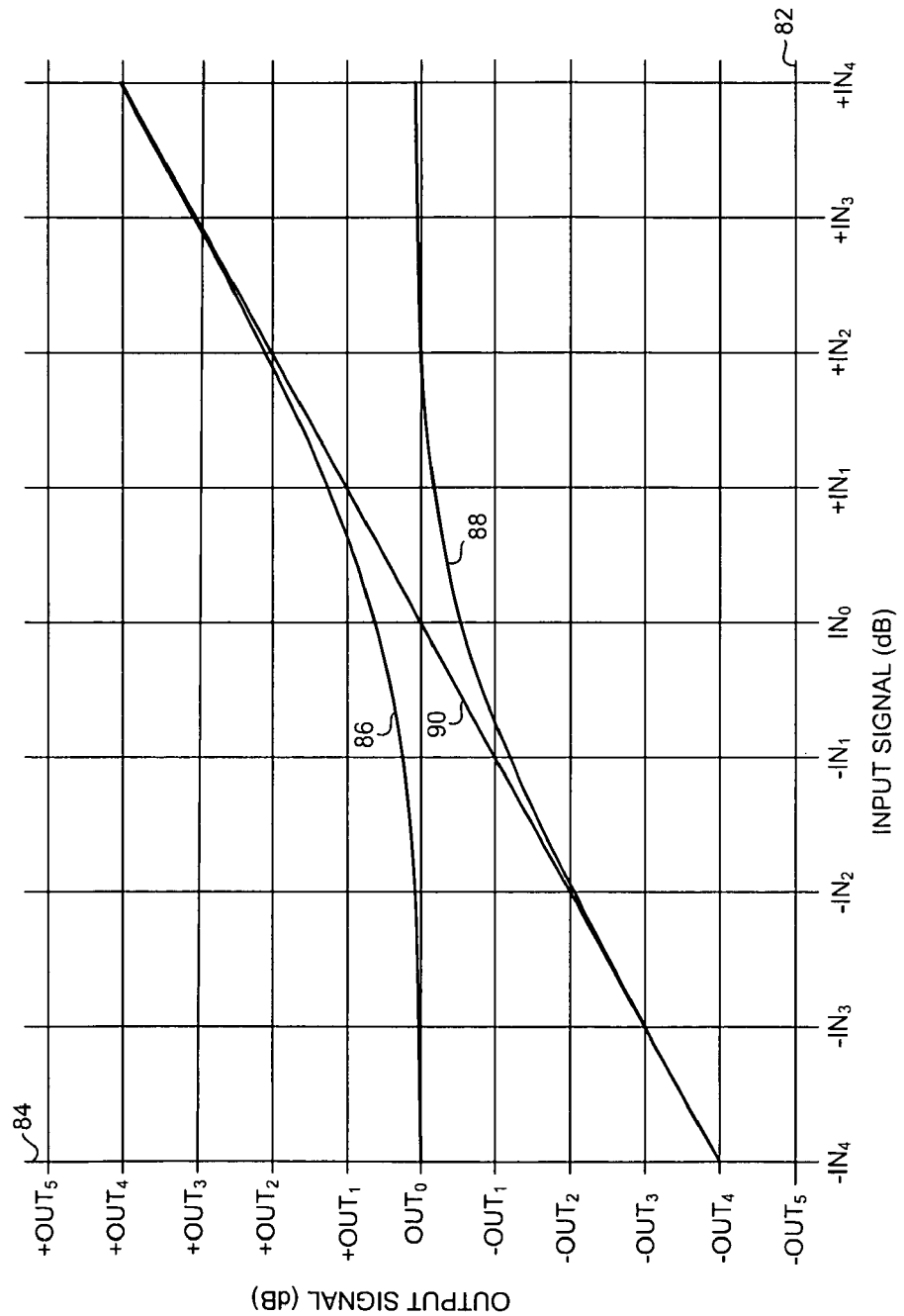
FIG. 2 is a graphic representation of selected signals associated with operation of the apparatus illustrated in FIG. 1.

FIG. 2 is a graphic representation of selected signals associated with operation of the apparatus illustrated in FIG. 1. In FIG. 2, a graphic representation 80 may present a horizontal axis 82 indicating input signal strength in decibels (dB) and a vertical axis 84 indicating output signal strength in decibels (dB).

A signal response curve 86 may represent a signal appearing at input 52 of summing unit 50 (FIG. 1). A signal response curve 88 may represent a signal appearing at input 56 of summing unit 50 (FIG. 1). A signal response curve 86 may represent a signal appearing at input 52 of summing unit 50 (FIG. 1).

Signal response curve 86 may be a signal from input signal detecting section 12. Signal response curve 88 may be a signal from second detection portion 16 (FIG. 1). When signal response curves 86, 88 may be added, as may be effected by summing unit 50 (FIG. 1), a substantially linear signal response, such as signal response curve 90, may result.

Figure 3:
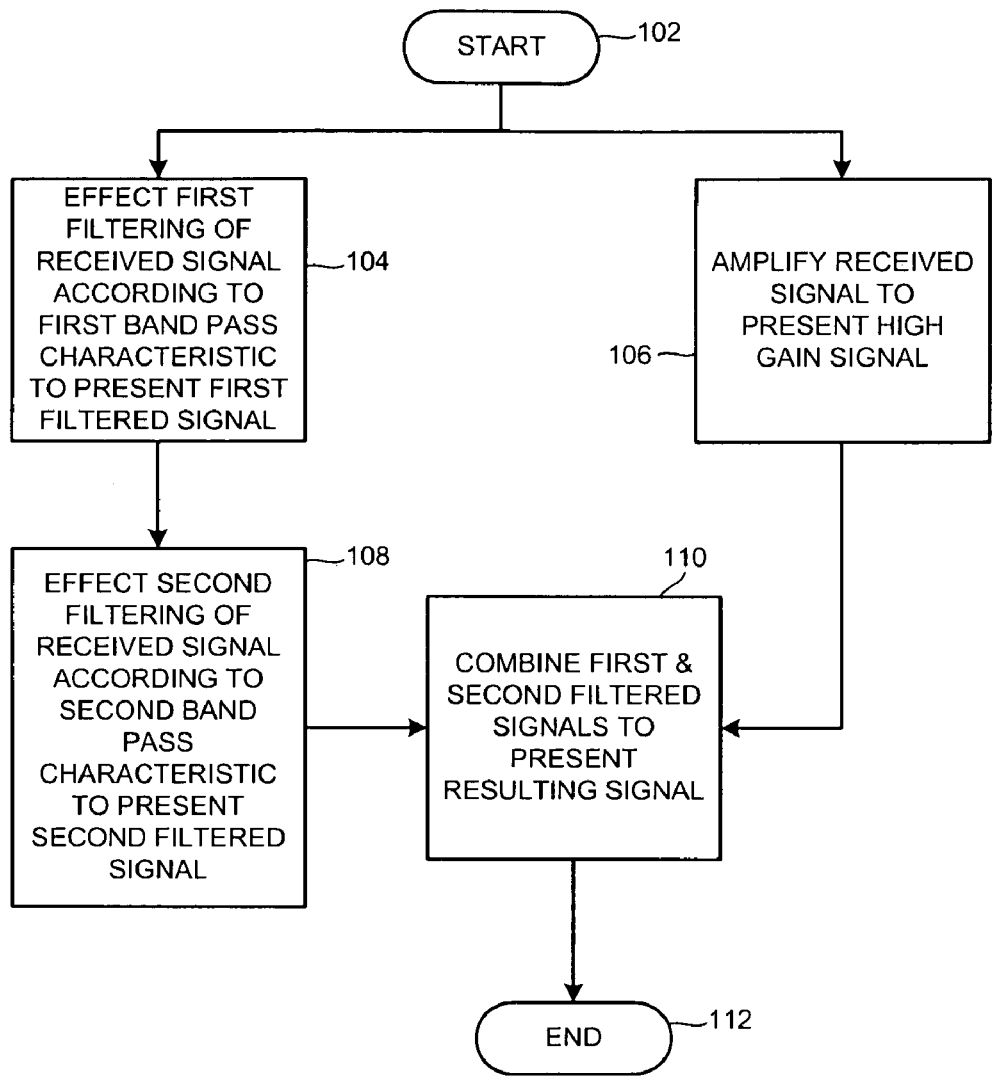
FIG. 3 is a flow chart illustrating the method of the present disclosure.

FIG. 3 is a flow chart illustrating the method of the present disclosure. In FIG. 3, a method 100 for treating a received signal to present a resulting signal representing the received signal with improved signal accuracy may begin at a START locus 102. Method 100 may continue with effecting a first filtering of the received signal according to a first bandpass characteristic to present a first filtered signal at a first circuit locus, as may be indicated by a block 104.

Method 100 may continue by, substantially simultaneously with the method step represented by block 104, amplifying the received signal to present a high gain signal, as may be indicated by a block 106.

Method 100 may continue with effecting a second filtering of the high gain signal according to a second bandpass characteristic to present a second filtered signal at a second circuit locus, as may be indicated by a block 108. The second bandpass characteristic may pass a narrower band than the first bandpass characteristic.

Method 100 may continue with combining the first filtered signal with the second filtered signal to present the resulting signal, as may be indicated by a block 110.

Method 100 may terminate at an END locus 112.

It is to be understood that, while the detailed drawings and specific examples given may describe preferred embodiments of the disclosure, they are for the purpose of illustration only, that the apparatus and method of the disclosure may not be limited to the precise details and conditions disclosed and that various changes may be made therein without departing from the spirit of the disclosure which is defined by the following claims:

I claim:

1. A signal treating apparatus for treating an input signal to present an output signal representing said input signal with improved signal accuracy over a predetermined signal range; the apparatus comprising:
  (a) an input signal receiving section coupled for receiving said input signal; said input signal receiving section presenting a first bandpass filtered representation of said input signal at a first circuit locus; said first bandpass filtered representation being limited to a first bandwidth; said input signal receiving section presenting a second bandpass filtered representation of said input signal at a second circuit locus; said second bandpass filtered representation being limited to a second bandwidth;
  (b) an amplifying unit coupled for receiving said first bandpass filtered representation and presenting an increased gain signal related with said first bandpass filtered representation at an amplifier output locus;
  (c) a detection portion coupled with said amplifier output locus; said detection portion presenting an indicator signal at a third circuit locus; said indicator signal being a third bandwidth representation of said increased gain signal; said indicator signal being limited to a third bandwidth less than said first bandwidth; and
  (d) a combining section coupled with said second circuit locus and said third circuit locus; said combining section presenting an output signal related with said second bandpass filtered representation of said input signal and said third bandpass filtered representation of said input signal; said input signal including an optical signal component and a radio frequency signal component.

2. A signal treating apparatus for treating an input signal to present an output signal representing said input signal with improved signal accuracy over a predetermined signal range as recited in claim 1 wherein said detection portion employs said radio frequency signal component for effecting said presenting said indicator signal.

3. A signal treating apparatus for treating an input signal to present an output signal representing said input signal with improved signal accuracy over a predetermined signal range as recited in claim 1 wherein said first bandwidth and said second bandwidth are substantially the same.

4. A signal treating apparatus for treating an input signal to present an output signal representing said input signal with improved signal accuracy over a predetermined signal range as recited in claim 2 wherein said first bandwidth and said second bandwidth are substantially the same.

5. A signal treating apparatus for treating an input signal to present an output signal representing said input signal with improved signal accuracy over a predetermined signal range as recited in claim 3 wherein said detection portion employs said radio frequency signal component for effecting said presenting said indicator signal.

6. A signal treating apparatus for treating an input signal to present an output signal representing said input signal with improved signal accuracy over a predetermined signal range as recited in claim 5 wherein said first bandpass filtered signal represents said optical signal component and said radio frequency signal component of said input signal and wherein said second bandpass filtered signal represents said optical signal component of said input signal.

7. A method for treating a received signal to present a resulting signal representing said received signal with improved signal accuracy; the method comprising:
  (a) in no particular order:
    (1) effecting a first filtering of said received signal according to a first bandpass characteristic to present a first filtered signal at a first circuit locus; and
    (2) effecting a second filtering of said received signal according to a second bandpass characteristic to present a second filtered signal at a second circuit locus;
  (b) amplifying said first bandpass representation to present a high gain signal;
  (c) effecting a bandwidth-limiting of said high gain signal to present a third bandwidth-limited signal at a third circuit locus; said third bandwidth-limited signal presenting a narrower band than said first bandpass representation; and
  (d) combining said second filtered signal with said third filtered signal to present said resulting signal; said received signal including an optical signal component and a radio frequency signal component.

8. A method for treating a received signal to present a resulting signal representing said received signal with improved signal accuracy as recited in claim 7 wherein said bandwidth-limiting employs said radio frequency signal component.

9. A method for treating a received signal to present a resulting signal representing said received signal with improved signal accuracy as recited in claim 7 wherein said first filtering is effected using a first filtering unit and wherein said second filtering is effected using a second filtering unit; said first filtering unit and said second filtering unit each including a plurality of bandwidth limiting devices treating said received signal to present a filtered received signal; said first filtering unit and said second filtering unit cooperating to select respective bandwidth limiting devices to present said filtered received signal within substantially the same frequency band from each of said first filtering unit and said second filtering unit.

10. A method for treating a received signal to present a resulting signal representing said received signal with improved signal accuracy as recited in claim 9 wherein said third filtering employs said radio frequency signal component.

11. A signal treating apparatus for treating an input signal to present an output signal representing said input signal with improved signal accuracy over a predetermined signal range; the apparatus comprising:
 (a) an input signal receiving section coupled for receiving said input signal; said input signal receiving section presenting a first bandpass filtered signal at a first circuit locus; said first bandpass filtered signal being limited to a first bandwidth; said input signal receiving section presenting a second bandpass filtered signal at a second circuit locus; said second bandpass filtered signal being limited to a second bandwidth;
 (b) an amplifying unit coupled for receiving said first bandpass filtered signal and presenting an increased gain signal at an amplifier output locus;
 (c) a detection portion coupled with said amplifier output locus; said detection portion presenting an indicator signal at a third circuit locus; said indicator signal being a third bandwidth-limited signal related with said input signal;
said third bandwidth-limited signal being limited to a third bandwidth less than said first bandwidth; and
 (d) a combining section coupled with said second circuit locus and said third circuit locus; said combining section presenting an output signal related with said first bandpass filtered signal and said second bandpass filtered signal; said input signal including an optical signal component and a radio frequency signal component.

12. A method for treating a received signal to present a resulting signal representing said received signal with improved signal accuracy; the method comprising:
 (a) in no particular order:
  (1) effecting a first filtering of said received signal according to a first bandpass characteristic to present a first filtered signal at a first circuit locus; and
  (2) effecting a second filtering of said received signal according to a second bandpass characteristic to present a second filtered signal at a second circuit locus
 (b) amplifying said first filtered signal to present a high gain signal;
 (c) effecting a bandwidth-limiting of said high gain signal to present a third bandwidth-limited signal at a third circuit locus; said third bandwidth-limited signal presenting a narrower band than said first filtered signal; and
 (d) a combining said second filtered signal with said third bandwidth-limited signal to present said resulting signal;
said first filtering being effected using a first filtering unit; said second filtering being effected using a second filtering unit; said first filtering unit and said second filtering unit each including a plurality of bandpass filtering devices treating said received signal to present a filtered received signal; said first filtering unit and said second filtering unit cooperating to select respective bandwidth limiting devices to present said filtered received signal within substantially the same frequency band from each of said first filtering unit and said second filtering unit.

\* \* \* \* \*